United States Patent

Harada et al.

[11] Patent Number: 6,050,276
[45] Date of Patent: Apr. 18, 2000

[54] APPARATUS AND METHOD FOR CLEANING A PRECISION SUBSTRATE

[75] Inventors: Yasuyuki Harada; Mitsuru Nakada, both of Tokyo; Tadahiro Ohmi, Miyagi, all of Japan

[73] Assignee: Pre-Tech Co., Ltd., Tokyo, Japan

[21] Appl. No.: 09/022,432

[22] Filed: Feb. 12, 1998

[30] Foreign Application Priority Data

Nov. 21, 1997 [JP] Japan .................................... 9-338108

[51] Int. Cl.$^7$ ........................................................ B08B 3/00
[52] U.S. Cl. ........................ 134/121; 134/119; 134/103; 134/2; 134/103.3
[58] Field of Search ............................ 156/345; 134/121, 134/119, 103.2, 103.3; 264/8

[56] References Cited

U.S. PATENT DOCUMENTS

| | | |
|---|---|---|
| 4,356,133 | 10/1982 | Cowen et al. ............................ 264/8 |
| 4,544,446 | 10/1985 | Cady ........................................ 156/639 |

*Primary Examiner*—William Krynski
*Assistant Examiner*—Hong J. Xu
*Attorney, Agent, or Firm*—Loeb & Loeb, LLP

[57] ABSTRACT

There are disclosed an apparatus and method for cleaning a precision substrate through use of high-frequency- or ultrasonic-applied cleaning liquid. An object substrate is horizontally held and rotated. High-frequency- or ultrasonic-applied cleaning liquid is jetted toward the surface of the object substrate from first cleaning liquid jetting unit disposed above the object substrate, and the nozzle of the first cleaning liquid jetting unit is moved in parallel with the surface of the object substrate. Cleaning liquid is also fed toward the central portion of the surface of the object substrate from cleaning liquid feed-to-center unit during cleaning. In the cleaning apparatus and method, a sufficiently high cleaning speed is attained. Further, there is not involved the problem that the film of cleaning liquid becomes thin on the central portion of a substrate during cleaning due to the effect of a centrifugal force with a resultant difficulty in transmission of high frequency or ultrasonic vibration to the central portion and the problem that during cleaning, due to the effect of a centrifugal force, no liquid film is present on the central portion, which thus becomes dry and contaminated. The cleaning apparatus and method also proves a cost advantage.

13 Claims, 2 Drawing Sheets

APPARATUS AND METHOD FOR CLEANING A PRECISION SUBSTRATE

BACKGROUND OF THE INVENTION

1. Field of the Invention

The present invention relates to an apparatus and method for cleaning, on a one-by-one basis, precision substrates such as semiconductor substrates, glass substrates for use in liquid crystal displays, and magnetic disks. Particularly, the invention relates to cleaning of a precision substrate through use of cleaning liquid to which high frequency or ultrasonic vibration is applied.

2. Description of the Related Art

Precision substrates such as semiconductor substrates and quartz substrates are used in the manufacture of semiconductor devices, liquid crystal displays, magnetic disks, and the like. A recent tendency to increase the degree of integration and precision of such devices has been accompanied by increasing demand for higher cleanliness of these substrates. Accordingly, improvement of technique for cleaning precision substrates is an essential factor for improving the quality and yield of advanced devices in their future manufacture.

Also, along with a recent tendency not only to improve the precision of precision substrates such as semiconductor substrates but also to increase the diameter and area of precision substrates, such precision substrates tend to be cleaned one by one rather than by batch cleaning in which a plurality of substrates are concurrently cleaned in a cleaning bath or the like.

According to a conventional apparatus or method for cleaning a single precision substrate, cleaning liquid to which high frequency or ultrasonic vibration is applied (hereinafter referred to as "high-frequency- or ultrasonic-applied cleaning liquid") is jetted from above onto the surface of a rotating object substrate.

This method has the following advantages: since high frequency or ultrasonic vibration is applied to cleaning liquid, cleaning is efficient; cleaning power is improved by increasing the jetting pressure of cleaning liquid; and since unlike the case of the above-mentioned method using a cleaning bath a substrate is always cleaned with new cleaning liquid, recontamination of the substrate with cleaning liquid does not occur.

Examples of a nozzle for jetting cleaning liquid are shown in FIGS. 2A and 2B. The nozzle shown in FIG. 2A has the shape of a truncated cone, and that shown in FIG. 2B has the shape of a trapezoid.

In a nozzle 41 having the shape of a truncated cone as shown in FIG. 2A, a vibrator 42, whose high frequency or ultrasonic generation surface has a circular shape, is attached to one end of the nozzle 41, and a cleaning liquid inlet port 43 is provided on the side surface of the nozzle 41. Cleaning liquid fed through the inlet port 43 is jetted from an opening 44 located at the other end of the nozzle 41 while high frequency or ultrasonic vibration is applied to the cleaning liquid. Through employment of this arrangement, an unillustrated object substrate can be cleaned intensively.

In a nozzle 41 having the shape of a trapezoid as shown In FIG. 2B, a vibrator 42, whose high frequency or ultrasonic generation surface has an elongated rectangular shape, is attached to one end of the nozzle 41, and cleaning liquid inlet ports 43 are provided on the side surfaces of the nozzle 41. Cleaning liquid fed through the inlet ports 43 is jetted from an opening 44 located at the other end of the nozzle 41 while high frequency or ultrasonic vibration is applied to the cleaning liquid. As compared with a truncated cone nozzle, the trapezoidal nozzle 41 can clean an object substrate over a wider area.

A nozzle of the type as shown in FIG. 2A (called a jet nozzle) has high cleaning power because of a high jetting pressure of cleaning liquid. However, since the area of cleaning covered by the nozzle is relatively small, the nozzle must be moved in a scanning manner or a like manner in order to jet cleaning liquid over the entire surface of an object substrate. Thus, cleaning a single substrate takes a relatively long time, resulting in a reduction in productivity. Further, when the nozzle is situated above the circumferential portion of a rotating substrate, cleaning liquid on the central portion of the substrate is centrifuged toward the circumference of the substrate. Thus, the thickness of liquid film on the central portion becomes thin, causing difficulty in transmission of high frequency or ultrasonic vibration to the central portion. As a result, the central portion is not cleaned effectively. In some case, no liquid film is present on the central portion, which thus becomes dry and contaminated.

By contrast, because of a relatively large area coverage of cleaning, a nozzle of the type as shown in FIG. 2B (called a squall nozzle) can readily jet cleaning liquid over the entire surface of a substrate and does not necessarily require scanning movement. Accordingly, this type of nozzle cleans a single substrate within a relatively short period of time and is free from the above-mentioned problem that the film of cleaning liquid becomes thin on the central portion of a substrate due to the effect of a centrifugal force with a resultant difficulty in transmission of high frequency or ultrasonic vibration to the central portion and is also free from the problem that due to the effect of a centrifugal force, no liquid film is present during cleaning on the central portion, which thus becomes dry and contaminated.

However, because of a lower jetting pressure of cleaning liquid, the squall nozzle is inferior to the jet nozzle in terms of cleaning power. Further, the squall nozzle is disposed above an object substrate, and a cleaning liquid jetting port is located under a high frequency or ultrasonic vibrator. Accordingly, bubbles generated within the squall nozzle are accumulated in the upper portion of the nozzle, i.e. just under the vibrator. As a result, high frequency or ultrasonic vibration becomes difficult to transmit to cleaning liquid, resulting in a reduction in cleaning power. To prevent this problem, cleaning liquid must be jetted at or above a certain jetting rate. As a result, not only does the consumption of cleaning liquid increase, but also cleaning liquid is jetted in a greater amount than required. This brings about a cost disadvantage.

SUMMARY OF THE INVENTION

The present invention has been accomplished to solve the above-mentioned problems, and an object of the invention is to provide an apparatus and method for cleaning a single precision substrate through use of high-frequency- or ultrasonic-applied cleaning liquid, the cleaning apparatus and method having the following features: a sufficiently high cleaning speed is attained; there is not involved the problem that the film of cleaning liquid becomes thin on the central portion of a substrate during cleaning due to the effect of a centrifugal force with a resultant difficulty in transmission of high frequency or ultrasonic vibration to the central portion and the problem that during cleaning, due to the effect of a centrifugal force, no liquid film is present on the central portion, which thus becomes dry and contaminated; there is not involved the problem that bubbles are accumulated just under a vibrator, causing a difficulty in transmission of high frequency or ultrasonic vibration to cleaning liquid and thus resulting in a reduction in cleaning power; and cleaning liquid consumption is appropriately limited so as to avoid waste of cleaning liquid, thereby providing a cost advantage.

To achieve the above object, the present invention provides a cleaning apparatus for cleaning an object substrate through use of high-frequency- or ultrasonic-applied cleaning liquid, the apparatus comprising at least: rotary holding means for horizontally holding and rotating the object substrate; first cleaning liquid jetting means located above the object substrate for jetting high-frequency- or ultrasonic-applied cleaning liquid toward the surface of the object substrate; nozzle holding means for holding the first cleaning liquid jetting means and for moving a cleaning liquid jetting nozzle in parallel with the surface of the object substrate; and cleaning liquid feed-to-center means for feeding cleaning liquid toward the central portion of the surface of the object substrate during cleaning.

Also, the present invention provides a method of cleaning a precision substrate through use of high-frequency- or ultrasonic-applied cleaning liquid, the method comprising at least the steps of: horizontally holding and rotating an object substrate; jetting high-frequency- or ultrasonic-applied cleaning liquid toward the surface of the object substrate from first cleaning liquid jetting means disposed above the object substrate; moving a cleaning liquid jetting nozzle of the first cleaning liquid jetting means in parallel with the surface of the object substrate; and feeding cleaning liquid toward the central portion of the surface of the object substrate from cleaning liquid feed-to-center means during cleaning.

As mentioned above, high-frequency- or ultrasonic-applied cleaning liquid is jetted toward a rotating object substrate from the nozzle disposed above the object substrate and adapted to move in parallel with the object substrate, and the cleaning liquid feed-to-center means is separately provided for feeding cleaning liquid toward the central portion of the object substrate and feeds cleaning liquid toward the surface of the central portion of the object substrate during cleaning. Accordingly, cleaning liquid film is always present on the central portion of the object substrate, thereby preventing the problem that the film of cleaning liquid becomes thin on the central portion of the substrate during cleaning due to the effect of a centrifugal force with a resultant difficulty in transmission of high frequency or ultrasonic vibration to the central portion and thereby reduction in cleaning efficiency, and the problem that during cleaning, due to the effect of a centrifugal force, no liquid film is present on the central portion, which thus becomes dry and contaminated. Thus, a sufficiently high cleaning speed is attained.

Also, since the nozzle is moved in parallel with an object substrate, the cleaning liquid jetting port of the nozzle can be rendered small, thereby preventing the problem that bubbles are accumulated just under the vibrator, which accumulation of bubbles causes a difficulty in transmission of high frequency or ultrasonic vibration to cleaning liquid and thus reduces cleaning power. Accordingly, cleaning liquid consumption can be sustained at an appropriately low level.

In this case, preferably, the first cleaning liquid jetting means is provided with a plurality of nozzles for jetting cleaning liquid.

Arrangement of a plurality of nozzles as mentioned above means arrangement of a plurality of small cleaning liquid jetting ports. Thus, with no increase of cleaning liquid feed, the area of cleaning can be increased to thereby significantly improve cleaning speed.

Preferably, in the above-mentioned cleaning apparatus, different kinds of cleaning liquid are fed through the plurality of nozzles.

Through employment of this arrangement that enables different kinds of cleaning liquid to be fed through the plurality of nozzles, an object substrate can be cleaned conveniently through use of multiple kinds of cleaning liquid, as needed.

Preferably, in the above-mentioned cleaning apparatus, the cleaning liquid feed-to-center means feeds high-frequency- or ultrasonic-applied cleaning liquid toward the central portion of the surface of an object substrate.

Preferably, in the above-mentioned method of cleaning a precision substrate, high-frequency- or ultrasonic-applied cleaning liquid is fed from the cleaning liquid feed-to-center means.

Through feed of high-frequency- or ultrasonic-applied cleaning liquid from the cleaning liquid feed-to-center means toward the central portion of an object substrate as mentioned above, high-frequency- or ultrasonic-applied cleaning liquid is reliably fed to the central portion of the substrate even when the nozzle of the first cleaning liquid jetting means is situated above the circumferential portion of the substrate. Thus, the entire surface of the substrate can be cleaned quite efficiently.

Preferably, in the above-mentioned cleaning apparatus, there is provided second cleaning liquid jetting means located under an object substrate for jetting cleaning liquid toward the back surface of the object substrate.

Preferably, the above-mentioned method of cleaning a precision substrate further comprises a step of jetting cleaning liquid toward the back surface of an object substrate from second cleaning liquid jetting means provided under the object substrate for cleaning the back surface of the substrate.

Through employment of the arrangement that the second cleaning liquid jetting means is provided under an object substrate so as to also jet cleaning liquid toward the back surface of the substrate as mentioned above, both surfaces of the substrate can be concurrently cleaned in an efficient manner.

Preferably, in the above-described cleaning apparatus, the second cleaning liquid jetting means jets high-frequency- or ultrasonic-applied cleaning liquid toward the back surface of an object substrate.

Preferably, the above-described method of cleaning a precision substrate further comprises a step of jetting high-frequency- or ultrasonic-applied cleaning liquid toward the back surface of an object substrate from the second cleaning liquid jetting means provided under the object substrate for cleaning the back surface of the substrate.

Through employment of this arrangement that high-frequency- or ultrasonic-applied cleaning liquid is jetted toward the back surface of an object substrate, the entire substrate can be more efficiently cleaned through the effect of high frequency or ultrasonic vibration.

Preferably, the above-mentioned cleaning apparatus is the closed type in which an object substrate is placed in a closed container so that the substrate can be cleaned in isolation from the atmosphere.

Through employment of the closed cleaning apparatus as mentioned above, an object substrate is not exposed to the atmosphere, thereby reducing atmosphere-induced contamination of the substrate.

Through use of the cleaning apparatus of the present invention, various kinds of precision substrates can be cleaned to a high degree of cleanliness at a sufficiently high cleaning speed, high efficiency, and low cost.

In the cleaning apparatus and method for cleaning a single precision substrate through use of high-frequency- or ultrasonic-applied cleaning liquid according to the present invention, cleaning liquid is jetted toward the surface of an object substrate from above, and the cleaning liquid feed-to-center means feeds cleaning liquid toward the central portion of the substrate. Thus, a sufficiently high cleaning speed is attained, and there is not involved the problem that the film of cleaning liquid becomes thin on the central portion of the substrate during cleaning due to the effect of a centrifugal force with a resultant difficulty in transmission of high frequency or ultrasonic vibration to the central portion and the problem that during cleaning, due to the effect of a centrifugal force, no liquid film is present on the central portion, which thus becomes dry and contaminated. Further, there is not involved the problem that bubbles are accumulated just under the vibrator, which accumulation of bubbles causes a difficulty in transmission of high frequency or ultrasonic vibration to cleaning liquid and thus reduces cleaning power. Also, there is avoided waste of cleaning liquid caused by an unnecessary increase in the amount of cleaning liquid.

DESCRIPTION OF THE INVENTION AND EMBODIMENT THEREOF

The present invention and an embodiment thereof will be described in detail with reference to the drawings.

Figure 1:
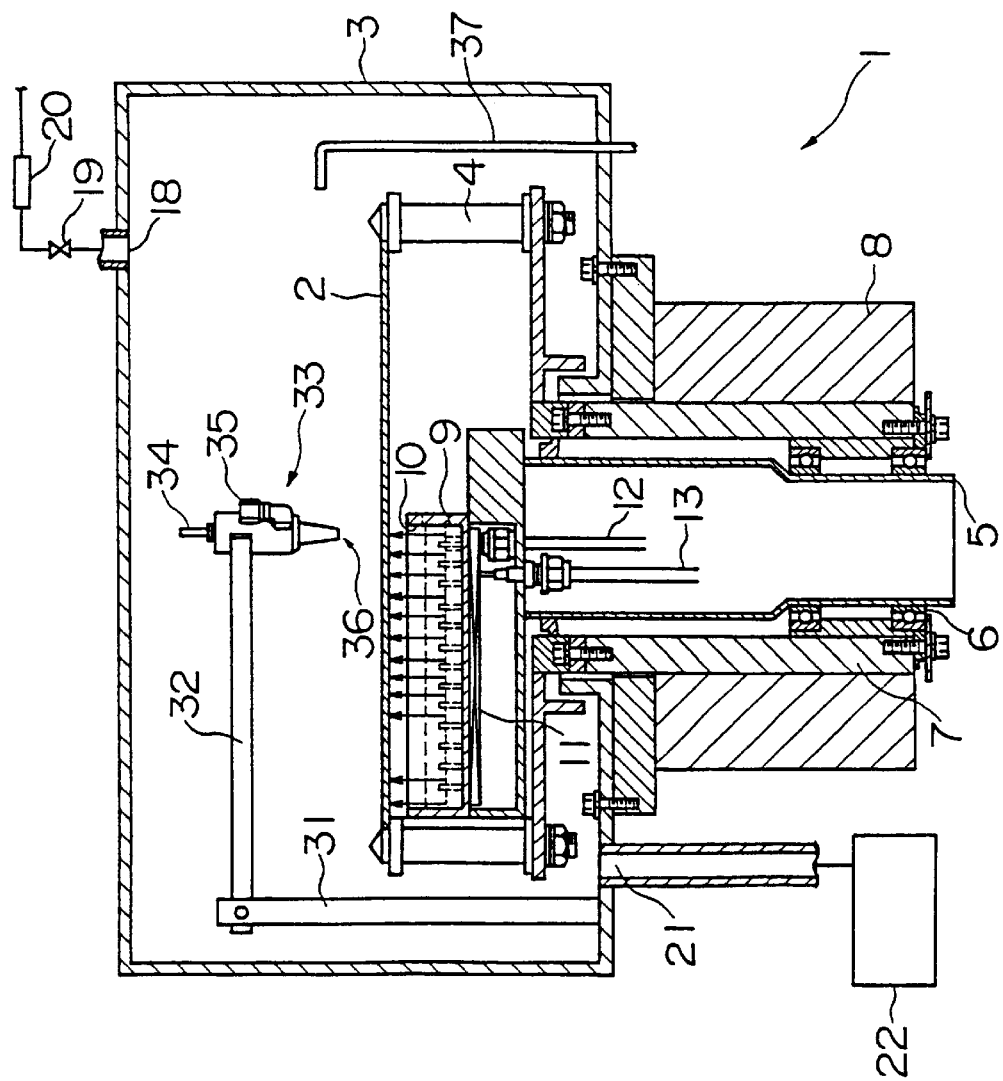
FIG. 1 is a sectional view showing an embodiment of a cleaning apparatus according to the present invention.
Figure 2A:
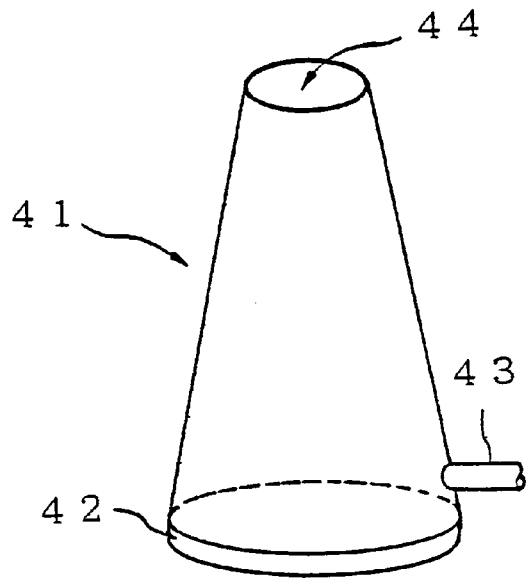
FIG. 2A is a view showing a truncated-cone-shaped nozzle for jetting cleaning liquid.
Figure 2B:
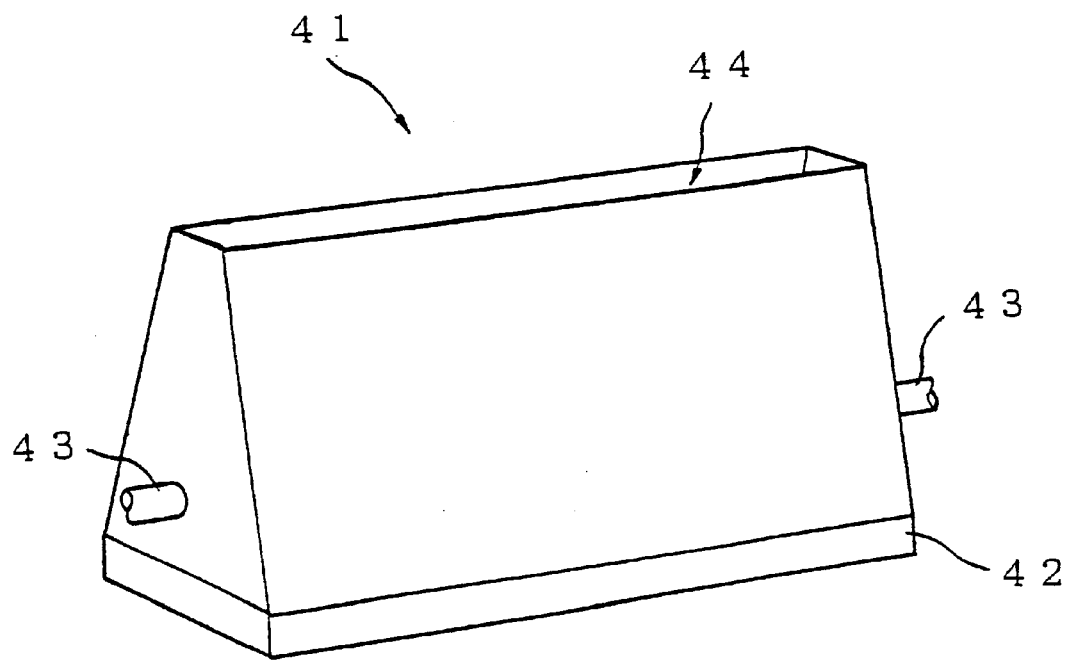
FIG. 2B is a view showing a trapezoidal nozzle for jetting cleaning liquid.

The inventors of the present invention conducted extensive studies in an attempt to obtain a cleaning apparatus for and a method of cleaning a single precision substrate through use of high-frequency- or ultrasonic-applied cleaning liquid, which cleaning apparatus and method have the following features: a sufficiently high cleaning speed is attained; there is not involved the problem that the film of cleaning liquid becomes thin on the central portion of a substrate during cleaning due to the effect of a centrifugal force with a resultant difficulty in transmission of high frequency or ultrasonic vibration to the central portion and the problem that during cleaning, due to the effect of a centrifugal force, no liquid film is present on the central portion, which thus becomes dry and contaminated; and cleaning liquid consumption is appropriately limited to thereby provide a cost advantage. Based on the studies, the present invention has been achieved. FIG. 1 shows an embodiment of a cleaning apparatus according to the present invention.

The present embodiment includes upper and lower cleaning liquid jetting means for jetting ultrasonic-applied cleaning liquid and means for feeding cleaning liquid toward the central portion of a substrate during cleaning. These means are arranged within a closed container so that an object substrate can be cleaned in isolation from the atmosphere.

In a closed cleaning apparatus 1 according to the present embodiment, an object substrate 2 is placed in a closed container 3 so that both front and back surfaces of the substrate 2 can be concurrently cleaned in isolation from the atmosphere.

A cylindrical fixed shaft 5 is inserted into the closed container 3 from the central portion of the bottom of the container 3. A rotary support member 7 is supported by the cylindrical fixed shaft 5 via a bearing 6 in such a manner as to be rotatable about the fixed shaft 5. A table 4 which horizontally holds the object substrate 2 is connected to the upper end portion of the rotary support member 7. A drive motor 8 is disposed such that it surrounds the lower end portion of the rotary support member 7.

As the rotary support member 7 is rotated by the drive motor 8, the object substrate 2 is rotated via the table 4. The table 4, the rotary support member 7, and the drive motor 8 correspond to the rotary holding means in the present invention.

Next will be described the first cleaning liquid jetting means and the nozzle holding means in the present invention. An arm 32 extending toward the central portion of the object substrate 2 is connected to the upper end portion of a support rod 31, which stands on the bottom portion of the closed container 3. An upper nozzle 33 having the shape of a truncated cone is attached to the tip portion of the arm 32. A vibrator having a circular high frequency or ultrasonic generation surface is attached to the upper end of the upper nozzle 33, and a power cable 34 is connected to the vibrator. A cleaning liquid feed pipe 35 is connected to the side surface of the upper nozzle 33. Cleaning liquid is fed into the upper nozzle 33 through the cleaning liquid feed pipe 35 and jetted from a jetting port 36 located at the bottom end of the nozzle 33 while ultrasonic vibration is applied to the cleaning liquid. Thus, the object substrate 2 can be intensively cleaned with the thus-jetted cleaning liquid.

The support rod 31 is rotatable about its vertical center axis. By rotatively reciprocating the support rod 31 by means of an unillustrated motor, the upper nozzle 33 can be moved in parallel with the surface of the object substrate 2.

In this case, in order to jet cleaning liquid over the entire object substrate 2, the upper nozzle 33 must be rotatively reciprocated at least over the range from the central portion of the object substrate 2 to the circumferential portion of the substrate 2.

The support rod 31 and the arm 32 correspond to the nozzle holding means in the present invention. The upper nozzle 33 and the cleaning liquid feed pipe 35 correspond to the first cleaning liquid jetting means.

In the present embodiment, a single jet nozzle is provided as the upper nozzle 33. However, a plurality of nozzles may be provided at the tip end portion of the arm 32 to thereby increase the area of cleaning for improving cleaning speed.

If the plurality of nozzles are adapted to jet different kinds of cleaning liquid, an object substrate can be cleaned conveniently through use of multiple kinds of cleaning liquid, as needed.

The type of an employed nozzle is not limited to a jet nozzle having the shape of a truncated cone. In principle, any type of nozzle may be used so long as a required jetting pressure of cleaning liquid is provided, and a jetting port is small so that cleaning liquid is not jetted in a greater amount than required.

The present invention comprises the cleaning liquid feed-to-center means. In the present embodiment, there is provided a fixed nozzle 37 which is inserted into the closed container 3 through the bottom portion of the container 3 and whose tip portion is directed toward the central portion of the object substrate 2. In the present embodiment, high frequency or ultrasonic vibration is not applied to cleaning liquid jetted from the fixed nozzle 37. However, high frequency or ultrasonic vibration may be applied to cleaning liquid at the tip end portion of the fixed nozzle 37. Cleaning liquid jetted from the fixed nozzle 37 may be identical to that jetted from the upper nozzle 33, but is not limited thereto. Water or other cleaning liquid may be jetted from the fixed nozzle 37.

Herein, the central portion of an object substrate is not in a strict sense, but may be somewhat shifted so long as a cleaning liquid film is prevented from becoming thin on or being absent from the central portion of a rotating object substrate.

Next will be described the second cleaning liquid jetting means in the present invention. A horizontally elongated lower nozzle 9 is fixed on the upper end of the cylindrical fixed shaft 5 and located under the object substrate 2. Discharge ports 10 for jetting cleaning liquid are formed in the upper surface of the lower nozzle 9. A vibrator 11 for generating high frequency or ultrasonic vibration is provided on the bottom portion of the lower nozzle 9 opposingly to the jetting ports 10. The lateral (horizontal) length of the lower nozzle 9 substantially coincides with the radius of the object substrate 2 when the substrate 2 is circular.

A cleaning liquid feed pipe 12 is run through the interior of the cylindrical fixed shaft 5 and connected to the lower nozzle 9 from underneath to thereby feed cleaning liquid to the lower nozzle 9. Also, a power cable 13 is run through the interior of the cylindrical fixed shaft 5 and connected to the vibrator 11 from the underneath. Thus, by feeding cleaning liquid to the lower nozzle 9 from the cleaning liquid feed pipe 12 and oscillating the vibrator 11, high-frequency- or ultrasonic-applied cleaning liquid can be jetted toward the backs surface of the object substrate 2.

In this case, high frequency or ultrasonic vibration may not be applied to cleaning liquid jetted from the lower nozzle 9. Further, the lower nozzle 9 itself is optional. These choices may be made in accordance with the object substrate 2 or the purpose of cleaning. Cleaning liquid jetted from the lower nozzle 9 may be identical to that jetted from the upper nozzle 33 or may be water or other cleaning liquid.

In the present embodiment, the length of the lower nozzle 33 is equivalent to the radius of the object substrate 2; however, since the substrate 2 is rotated, the entire substrate 2 can be uniformly cleaned. The lower nozzle 33 may be more elongated so as to jet cleaning liquid across the entire object substrate 2.

In the cleaning apparatus 1, gas feed means for feeding an inert gas to the object substrate 2 and gas exhaust means are connected to the closed container 3. Each of the gas feed means and the gas exhaust means is provided with a gas flow regulator.

Specifically, a gas feed port 18 is formed in the ceiling portion of the closed container 3, and a gas line is connected to the port 18 via a valve 19 and a flowmeter 20.

A gas exhaust port 21 is formed in the bottom portion of the closed container 3, and an exhaust flow regulator 22 is connected to the port 21. An example of the exhaust flow regulator 22 is a mass flow controller.

An unillustrated gate valve is provided on the side surface of the closed container 3 at a position horizontally corresponding to the table 4 so that the object substrate 2 can be loaded into or unloaded from the closed container 3 through use of an unillustrated substrate handling apparatus.

Next will be described a method of cleaning a precision substrate through use of the cleaning apparatus 1.

First, the unillustrated gate valve located on the side surface of the closed container 3 is opened. The object substrate 2 is set on the table 4 through use of the unillustrated substrate handling apparatus. In this case, when the object substrate 2 has, for example, the main surface on which devices are to be fabricated, the object substrate 2 is set such that the main surface faces upward. The main surface preferably faces upward because the upper surface of the object substrate 2 is cleaned through use of the upper nozzle 33 and the fixed nozzle 37, and the back surface of the object substrate 2 is unavoidably in contact with the table 4.

However, in the present embodiment, since both front and back surfaces of the object substrate 2 can be concurrently cleaned, either surface can face upward when the object substrate 2 is set for cleaning.

When the object substrate 2 is set on the table 4, the gate valve is closed to close the container 3 tightly.

Next, an inert gas for the object substrate 2 is led into the closed container 3 through the gas feed port 18. At the same time, the interior gas of the closed container 3 is removed through the gas exhaust port 21 to thereby replace the interior gas with a desired gas. Examples of gas to be fed into the closed container 3 include an inert gas, such as argon and helium, and nitrogen. For a certain type of a substrate, a mixture gas composed of any of the above-described gases and oxygen may be used. Gas to be fed may be selected in accordance with the type of an object substrate and the purpose of cleaning.

In order to reduce replacement time, after the object substrate 2 is set for cleaning, the closed container 3 may be evacuated.

After the interior gas of the closed container 3 is replaced with a desired gas, the feed gas flow and the exhaust gas flow are controlled by means of the valve 19, the flowmeter 20, and the exhaust flow regulator 22 to thereby establish desired conditions, such as pressure, of the gas atmosphere within the closed container 3.

When a desired gas atmosphere is established within the closed container 3, cleaning of the object substrate 2 is started. The object substrate 2 is rotated by rotating the table 4, and at the same time, cleaning liquid is jetted from the upper nozzle 33 and the lower nozzle 9. Discharging high-frequency- or ultrasonic-applied cleaning liquid, the upper nozzle 33 is swung over the range from the center of the object substrate 2 to the circumferential edge of the substrate 2. During this cleaning, cleaning liquid is fed to the central portion of the object substrate 2 from the fixed nozzle 37. Thus, even when the object substrate 2 is rotated at high speed, and the upper nozzle 33 is swung, there can be avoided the problem that the central portion of the object substrate 2 becomes dry and the problem that the film of cleaning liquid becomes thin on the central portion of the object substrate 2 with a resultant reduction in cleaning efficiency. Accordingly, the front surface of the object substrate 2 is effectively cleaned by high-frequency- or ultrasonic-applied cleaning liquid jetted from the upper nozzle 33 and cleaning liquid jetted from the fixed nozzle 37. Also, the back surface of the object substrate 2 is cleaned by cleaning liquid jetted from the lower nozzle 9.

The frequency of high frequency or ultrasonic vibration to be applied to cleaning liquid is not particularly limited, but may be selected from within the range from 0.02 MHz to 30 MHz in accordance with the type of an object substrate, the purpose of cleaning, and the like.

Also, cleaning liquid is not particularly limited, and may be selected from acid, alkali, organic solvents, pure water, and the like in accordance with the type of an object substrate, the purpose of cleaning, and the like. Not only is a single kind of cleaning liquid used for cleaning, but also multiple kinds of cleaning liquid may be used one after the other for multi-stage cleaning.

When cleaning is completed, jetting of cleaning liquid from the upper nozzle 33, the fixed nozzle 37, and the lower nozzle 9 is stopped. By rotating the table 4 at high speed, cleaning liquid remaining on the object substrate 2 is flung away to thereby render the object substrate 2 dry. Thereafter, the gate valve is opened to unload the object substrate 2 from the closed container 3. Then, operation proceeds to a step for cleaning the next substrate.

The present invention is not limited to the above-described embodiment. The above-described embodiment is a mere example, and those having the substantially same structure as that described in the appended claims and providing the similar action and effects are included in the scope of the present invention.

For example, in the above-described embodiment, the rotary holding means, the cleaning liquid feed-to-center means, and the second cleaning liquid jetting means are stationary in a horizontal direction. However, any one or more of these means may be horizontally movable.

Also, the nozzle holding means for moving the nozzle of the first cleaning liquid jetting means in parallel with the surface of an object substrate is not limited to the mechanism that rotates the support rod. A slide mechanism that moves the support rod itself horizontally may be employed.

In this case, an object substrate is not only rotated but also moved horizontally relative to the cleaning liquid jetting means. Thus, the object substrate can be cleaned more efficiently. Also, for example, even when the length or size of a nozzle for jetting cleaning liquid is small as compared with the diameter of an object substrate, the entire surface of the substrate can be cleaned.

Also, in the above-described embodiment, means for rotating a substrate is such that the rotary support member is directly rotated by the drive motor. However, the present invention is not limited thereto. Any mechanism is acceptable as the means so long as a substrate can be rotated. For example, the rotary support member may be provided with a pulley, so that the pulley is rotated as a timing pulley on the driven side.

Further, in the above-described embodiment, for connection with gas feed means for supplying an inert gas into the closed chamber and with gas exhaust means, the closed container has the gas feed port formed in its ceiling portion and the gas exhaust port formed in its bottom portion. However, the present invention is not limited thereto. In principle, any type of connection is acceptable so long as gas can be fed into and removed from the closed container.

Herein, cleaning must be interpreted in a broad sense. Specifically, cleaning includes cleaning through use of acid, alkali, an organic solvent, or mixture of any of them and a surfactant or the like, cleaning through use of pure water, and a combination of these types of cleaning for multi-stage cleaning.

What is claimed is:

1. A cleaning apparatus for cleaning an object substrate through use of high-frequency- or ultrasonic-applied cleaning liquid, said apparatus comprising:

rotary holding means for horizontally holding and rotating the object substrate;

first cleaning liquid jetting means located above the object substrate for jetting high-frequency- or ultrasonic-applied cleaning liquid toward the surface of the object substrate;

nozzle holding means for holding said first cleaning liquid jetting means and for moving a cleaning liquid jetting nozzle in parallel with the surface of the object substrate; and cleaning liquid feed-to-center means for feeding cleaning liquid toward the central portion of the surface of the object substrate during cleaning.

2. A cleaning apparatus according to claim 1, wherein said first cleaning liquid jetting means includes a plurality of nozzles for jetting cleaning liquid.

3. A cleaning apparatus according to claim 2, wherein different kinds of cleaning liquid are fed through said plurality of nozzles.

4. A cleaning apparatus according to claim 1, wherein said cleaning liquid feed-to-center means feeds high-frequency- or ultrasonic-applied cleaning liquid toward the central portion of the surface of the object substrate.

5. A cleaning apparatus according to claim 2, wherein said cleaning liquid feed-to-center means feeds high frequency- or ultrasonic-applied cleaning liquid toward the central portion of the surface of the object substrate.

6. A cleaning apparatus according to claim 3, wherein said cleaning liquid feed-to-center means feeds high-frequency- or ultrasonic-applied cleaning liquid toward the central portion of the surface of the object substrate.

7. A cleaning apparatus according to claim 1, characterized by further comprising second cleaning liquid jetting means located under the object substrate for jetting cleaning liquid toward the back surface of the object substrate.

8. A cleaning apparatus according to claim 2, characterized by further comprising second cleaning liquid jetting means located under the object substrate for jetting cleaning liquid toward the back surface of the object substrate.

9. A cleaning apparatus according to claim 3, characterized by further comprising second cleaning liquid jetting means located under the object substrate for jetting cleaning liquid toward the back surface of the object substrate.

10. A cleaning apparatus according to claim 7, wherein said second cleaning liquid jetting means jets high-frequency- or ultrasonic-applied cleaning liquid toward the back surface of an object substrate.

11. A cleaning apparatus according to claim 8, wherein said second cleaning liquid jetting means jets high-frequency- or ultrasonic-applied cleaning liquid toward the back surface of an object substrate.

12. A cleaning apparatus according to claim 9, wherein said second cleaning liquid jetting means jets high-frequency- or ultrasonic-applied cleaning liquid toward the back surface of an object substrate.

13. A cleaning apparatus according to claim 1, wherein the object substrate is placed in a closed container so that the object substrate is cleaned in isolation from the atmosphere.

* * * * *